(12) United States Patent
Chen

(10) Patent No.: US 8,831,935 B2
(45) Date of Patent: Sep. 9, 2014

(54) NOISE FEEDBACK CODING FOR DELTA MODULATION AND OTHER CODECS

(75) Inventor: Juin-Hwey Chen, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 75 days.

(21) Appl. No.: 13/528,551

(22) Filed: Jun. 20, 2012

(65) Prior Publication Data
US 2013/0346072 A1 Dec. 26, 2013

(51) Int. Cl.
*G10L 21/02* (2013.01)

(52) U.S. Cl.
USPC ........................................ 704/226

(58) Field of Classification Search
USPC ........................................ 704/226
See application file for complete search history.

(56) References Cited

U.S. PATENT DOCUMENTS

| | | | | |
|---|---|---|---|---|
| 6,092,039 A * | 7/2000 | Zingher | | 704/221 |
| 7,110,953 B1 * | 9/2006 | Edler et al. | | 704/200.1 |
| 7,983,907 B2 * | 7/2011 | Visser et al. | | 704/227 |
| 8,090,120 B2 * | 1/2012 | Seefeldt | | 381/104 |
| 8,208,660 B2 * | 6/2012 | Sollenberger et al. | | 381/107 |
| 8,345,902 B2 * | 1/2013 | Ma et al. | | 381/318 |
| 2003/0036901 A1 * | 2/2003 | Chen | | 704/230 |
| 2003/0220801 A1 * | 11/2003 | Spurrier | | 704/503 |
| 2005/0222626 A1 * | 10/2005 | DiLorenzo | | 607/2 |
| 2005/0228647 A1 * | 10/2005 | Fisher | | 704/205 |
| 2006/0251261 A1 * | 11/2006 | Christoph | | 381/1 |
| 2007/0021958 A1 * | 1/2007 | Visser et al. | | 704/226 |
| 2007/0124139 A1 * | 5/2007 | Chen | | 704/219 |
| 2009/0006084 A1 * | 1/2009 | Chen | | 704/211 |

* cited by examiner

*Primary Examiner* — Michael N Opsasnick
(74) *Attorney, Agent, or Firm* — Fiala & Weaver P.L.L.C.

(57) ABSTRACT

Systems and methods are described that apply a noise feedback coding (NFC) technique at the encoder of a delta modulation codec, such as a Continuously Variable Slope Delta Modulation (CVSD) codec, so as to shape the spectrum of the coding noise produced thereby in such a way that the speech quality of the delta modulation decoder output is enhanced. The techniques described herein are not limited to delta modulation codecs and may also be applied to any sample-by-sample codec, including a G.711 μ-law codec, a linear pulse code modulation (LPCM), or any other of a wide variety of sample-by-sample codecs, to improve the audio quality of the decoder output thereof.

20 Claims, 9 Drawing Sheets

NOISE FEEDBACK CODING FOR DELTA MODULATION AND OTHER CODECS

FIELD OF TECHNOLOGY

The present invention generally relates to systems that encode audio signals, such as music and speech signals, for transmission or storage and/or that decode encoded audio signals for playback.

BACKGROUND

Audio coding refers to the application of data compression to audio signals such as music and speech signals. In audio coding, a "coder" encodes an input audio signal into a digital bit stream for transmission or storage, and a "decoder" decodes the bit stream into an output audio signal. The combination of the coder and the decoder is called a "codec." The goal of audio coding is usually to reduce the encoding bit rate while maintaining a certain degree of perceptual audio quality. For this reason, audio coding is sometimes referred to as "audio compression." When audio coding is applied specifically to speech signals, it is often referred to as speech coding.

One type of speech coding known in the art is termed Continuously Variable Slope Delta Modulation (CVSD). CVSD is a delta modulation technique with a variable step size that was first proposed by J. A. Greefkes and K. Riemens in "Code Modulation with Digitally Controlled Companding for Speech Transmission," Philips Tech. Rev., pp. 335-353 (1970), the entirety of which is incorporated by reference herein. CVSD is a sample-by-sample source coding method that encodes at 1 bit per sample. Thus, in accordance with CVSD, audio that is sampled at 64 kilohertz (kHz) is encoded at 64 kilobits/second (kbit/s).

In CVSD, the encoder maintains a reference sample and a step size. Each input sample is compared to the reference sample. If the input sample is equal or larger, the encoder emits a "0" bit and adds the step size to the reference sample. If the input sample is smaller, the encoder emits a "1" bit and subtracts the step size from the reference sample. The CVSD encoder also keeps the previous K bits of output (K=3 or K=4 are very common) to determine adjustments to the step size; if J of the previous K bits are all "1"s or "0"s (J=3 or J=4 are also common), the step size is increased by a fixed amount. Otherwise, the step size remains the same (although it may be multiplied by a decay factor which is slightly less than 1). The step size is adjusted for every input sample processed.

A CVSD decoder starts with the reference sample, and adds or subtracts the step size according to the bit stream. The sequence of adjusted reference samples constitutes the reconstructed audio waveform, and the step size is increased or maintained in accordance with the same all-1s-or-0s logic as in the CVSD encoder.

In CVSD, the adaptation of the step size helps to minimize the occurrence of coding noise in the form of slope overload and granular noise. Slope overload occurs when the slope of the audio signal is so steep that the encoder cannot keep up. Adaptation of the step size in CVSD helps to minimize or prevent this effect by enlarging the step size sufficiently. Granular noise occurs when the audio signal is not in the slope overload condition. A CVSD system has no symbols to represent steady state, so a constant input is represented by alternate ones and zeros. Accordingly, the effect of granular noise is minimized when the step size is sufficiently small.

CVSD has been referred to as a compromise between simplicity, low bit rate, and quality. Different forms of CVSD are currently used in a variety of applications. For example, a 12 kbit/s version of CVSD is used in the SECURENET® line of digitally encrypted two-way radio products produced by Motorola, Inc. of Schaumburg, Ill. A 16 kbit/s version of CVSD is used by military digital telephones (referred to as Digital Non-Secure Voice Terminals (DNVT) and Digital Secure Voice Terminals (DSVT)) for use in deployed areas to provide voice recognition quality audio. The BLUETOOTH® specification for wireless personal area networks (PANs) specifies a 64 kbit/s version of CVSD that may be used to encode voice signals in telephony-related BLUETOOTH® service profiles, e.g. between mobile phones and wireless headsets.

The 64 kbits/s version of CVSD defined by the BLUETOOTH® specification is used to encode an 8 kHz input speech signal. Since CVSD encodes at 1 bit per sample, the 8 kHz input speech signal must be up-sampled to 64 kHz prior to encoding thereof. Furthermore, the 64 kHz decoded speech signal produced by the CVSD decoder must be down-sampled to produce an 8 kHz output speech signal. Thus, a conventional implementation of CVSD for BLUETOOTH® typically includes an up-sampling stage that precedes the encoder and a down-sampling stage that follows the decoder. The BLUETOOTH® specification does not specify how such sampling rate conversion (SRC) stages should be implemented. However, the BLUETOOTH® specification does require that the attenuation of the stopband (~4-32 kHz) be greater than 20 dB relative to the passband (~0-4 kHz). It has been observed in practice that the requirement of greater than 20 dB stopband attenuation is too loose and a CVSD implementation for BLUETOOTH® having 20-30 dB stopband attenuation may still produce fairly audible distortion.

As compared to other sample-by-sample codecs, CVSD is more robust to random bit errors. However, as compared to other toll quality codecs, the overall quality of the speech signal produced by CVSD leaves something to be desired. Thus, there exists a desire to improve CVSD speech quality.

One approach to improving CVSD speech quality for a BLUETOOTH® implementation involves optimizing certain filters applied in the previously-discussed up-sampling and down-sampling stages in order to achieve increased stopband attenuation. While such an approach can produce an improvement in speech quality, such an approach alone may not be sufficient to achieve the same speech quality as that achieved by other toll-quality codecs.

Another approach to improving CVSD speech quality could entail modifying the CVSD encoding rules. However, such a modification would affect bit-stream compatibility with the BLUETOOTH® CVSD standard and codecs that implemented such an approach would not be interoperable with the large installed base of existing CVSD codecs.

Yet another approach to improving CVSD speech quality could involve introducing an adaptive post-filter after the CVSD decoder to reduce the perceived level of granular coding noise. However, such an adaptive post-filter would distort the speech itself. Thus, if distortion of the speech signal is sought to be avoided, this solution is not an attractive one.

What is needed then is a system and method for improving the speech quality of a CVSD codec. The desired system and method should not entail modifying the CVSD encoding rules or require the use of an adaptive post-filter that may distort the speech signal. It would be beneficial if the desired system and method were also applicable to other delta modulation codecs as well as to any sample-by-sample audio codec.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
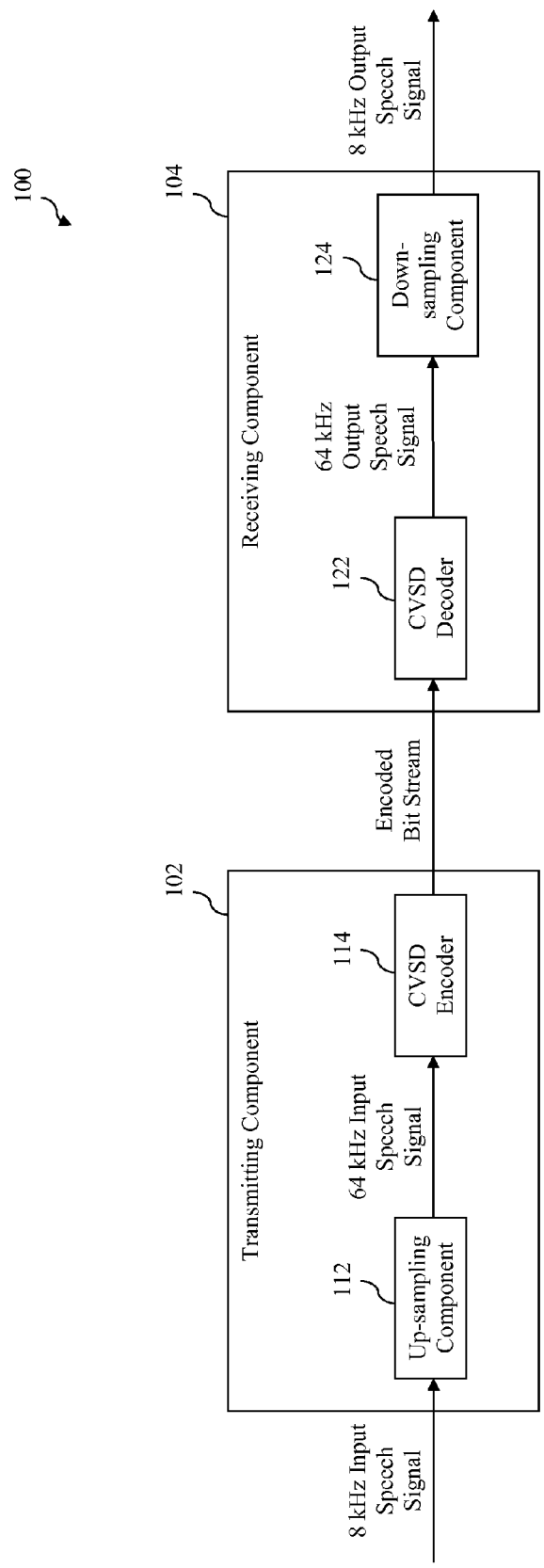
FIG. 1 is a block diagram of an example BLUETOOTH® wireless communication system that includes a BLUETOOTH®-compliant Continuously Variable Slope Delta Modulation (CVSD) codec.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

A. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the art to implement such feature, structure, or characteristic in connection with other embodiments whether or not explicitly described.

It should be understood that the while portions of the following description refer to the processing of speech signals, the embodiments described herein can be used to process any kind of general audio signal. Therefore, the term "speech" is used purely for convenience of description and is not limiting. Whenever the term "speech" is used, it can represent either speech or a general audio signal.

Various systems and methods are described herein that apply a novel noise feedback coding (NFC) technique at the encoder of a delta modulation codec, such as a Continuously Variable Slope Delta Modulation (CVSD) codec, so as to shape the spectrum of the coding noise produced thereby in such a way that the speech quality of the delta modulation decoder output is enhanced. However, the techniques described herein are not limited to delta modulation codecs and may also advantageously be applied to any sample-by-sample codec, including G.711 μ-law or A-law codec, linear pulse code modulation (LPCM) codec, G.726 adaptive differential pulse code modulation (ADPCM) codec, or any other of a wide variety of sample-by-sample codecs, to improve the audio quality of the decoder output thereof.

In one particular embodiment, a fixed second-order finite impulse response (FIR) filter is added in a feedback loop around a CVSD codec implemented in accordance with the BLUETOOTH® specification. By adding the filter in this manner, coding noise in the 0 to 4 kHz passband can be reduced at the cost of increasing the coding noise in the 4 to 32 kHz stopband. Such elevated coding noise in the 4 to 32 kHz stopband can later be filtered out during sampling rate conversion (SRC) of the decoded audio signal from 64 kHz to 8 kHz, leaving a net effect of reduced coding noise in the 0 to 4 kHz passband. It has been observed that application of this technique to a particular implementation of a BLUETOOTH®-compliant CVSD codec results in an audible reduction of CVSD coding noise and a significant improvement of the Perceptual Evaluation of Speech Quality (PESQ) score (ITU-T Recommendation P.862) by as much as 0.23. Since such improvement can be achieved in a manner that does not affect bit-stream compatibility, the techniques described herein can be applied to any CVSD encoder without affecting its interoperability with millions of existing CVSD decoders. This can be achieved with an extremely low complexity and the technique can be very easily implemented in hardware or software.

This particular embodiment and other embodiments will be described in more detail below. In particular, section B will describe a conventional BLUETOOTH®-compliant CVSD codec so as to provide an example of a codec that may benefit from the NFC technique described herein. Section C will describe embodiments that apply the NFC technique at the encoder of the example BLUETOOTH®-compliant CVSD codec. Section D will describe more generalized embodiments in which the NFC technique is applied to an encoder of a generic sample-by-sample codec. Section E will describe a processor-based system that may be used to implement various embodiments described herein. Finally, Section F will provide some concluding comments.

B. Example CVSD Codec Implementation

An example of a conventional BLUETOOTH®-compliant CVSD codec will now be described so as to provide an example of a codec that may benefit from the novel NFC technique described herein. However, it is noted that the techniques described herein are not limited to CVSD codecs or even delta modulation codecs. Rather, such techniques may advantageously be applied to any sample-by-sample codec to improve the audio quality of the decoder output thereof.

The example BLUETOOTH®-compliant CVSD codec may form part of a BLUETOOTH® wireless communication system 100 shown in block diagram form in FIG. 1. As shown in FIG. 1, system 100 includes both a transmitting component 102 and a receiving component 104. Transmitting component 102 includes an up-sampling component 112 and a CVSD encoder 114. Up-sampling component 112 operates to receive an input speech signal sampled at 8 kHz and to perform 1:8 up-sampling thereupon to produce an up-sampled representation of the input speech signal that is sampled at 64 kHz. Up-sampling component 112 may also be configured to perform filtering operations that attenuate spectral components produced in a stopband of 4 to 32 kHz as a result of such up-sampling. The 64 kHz input speech signal is then provided to CVSD encoder 114 which encodes the signal on a sample-by-sample basis to generate a CVSD-encoded bit stream. The CVSD-encoded bit stream is wirelessly transmitted to receiving component 104.

As further shown in FIG. 1, receiving component 104 includes a CVSD decoder 122 and a down-sampling component 124. CVSD decoder 122 receives the encoded bit stream and applies CVSD decoding thereto to produce a decoded output speech signal sampled at 64 kHz. The 64 kHz output speech signal is passed to down-sampling component 124 which performs 8:1 down-sampling thereon to produce a down-sampled representation of the output speech signal that is sampled at 8 kHz. Down-sampling component 124 may also be configured to perform filtering operations that attenuate spectral components of the 64 kHz output speech signal that are present in a stopband of 4 to 32 kHz.

Figure 2:
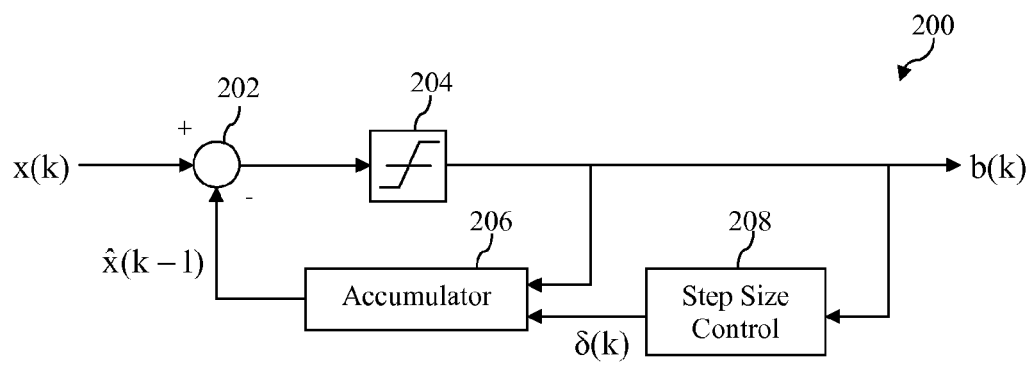
FIG. 2 is a block diagram of an example BLUETOOTH®-compliant CVSD encoder.

Example implementations of CVSD encoder 114 and CVSD decoder 122 of BLUETOOTH® wireless communication system 100 will now be described. In particular, FIG. 2 is a block diagram of a CVSD encoder 200 that may be used to implement CVSD encoder 114 of system 100. As shown in FIG. 2, the input to CVSD encoder 200 is denoted x(k), which is a speech sample of the 64 kHz input speech signal at time index k.

As shown in FIG. 2, a combiner 202 is configured to subtract a predicted version of input speech sample x(k), denoted $\hat{x}(k-1)$, from input speech sample x(k). A logic block 204 is configured to apply a sign function to the difference to derive a sign signal b(k). The sign function is defined such that:

$$\text{sgn}(x) = \begin{cases} 1, & \text{for } x \geq 0, \\ -1, & \text{otherwise.} \end{cases} \quad (1)$$

Thus, if the value of input speech sample x(k) is greater than or equal to the value of predicted sample $\hat{x}(k-1)$, then the value of b(k) will be 1; otherwise the value of b(k) will be −1.

In one implementation, when b(k) is transmitted on the air, it is represented by a sign bit such that negative numbers are mapped on "1" and positive numbers are mapped on "0".

Step size control block 208 is configured to determine a step size associated with the current input speech sample, denoted δ(k). To determine δ(k), step size control block 208 is configured to first determine the value of a syllabic companding parameter, denoted α. The syllabic companding parameter α is determined as follows:

$$\alpha = \begin{cases} 1, & \text{if } J \text{ bits in the last } K \text{ output bits are equal,} \\ 0, & \text{otherwise.} \end{cases} \quad (2)$$

In one implementation, the parameter J=4 and the parameter K=4. Based on the value of the syllabic companding parameter α, step size control block 208 is configured to determine the step size δ(k) in accordance with:

$$\delta(k) = \begin{cases} \min(\delta(k-1) + \delta_{min}, \delta_{max}), & \alpha = 1, \\ \max(\beta\delta(k-1), \delta_{min}), & \alpha = 0, \end{cases} \quad (3)$$

wherein δ(k−1) is the step size associated with the previous input speech sample, $\delta_{min}$ is the minimum step size, $\delta_{max}$ is the maximum step size, and β is a decay factor for the step size. In one implementation, $$\delta_{min} = 10, \delta_{max} = 1280 \text{ and } \beta = 1 - \frac{1}{1024}.$$

Figure 4:
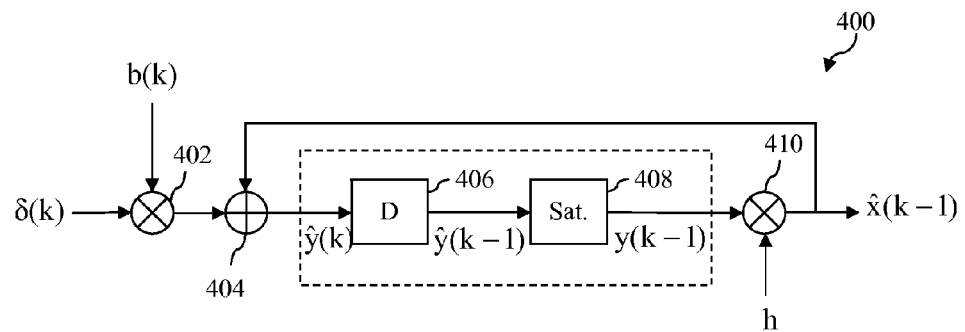
FIG. 4 is a block diagram of an accumulator implemented by both the example BLUETOOTH®-compliant CVSD encoder of FIG. 2 and the example BLUETOOTH®-compliant CVSD decoder of FIG. 3.

As further shown in FIG. 2, an accumulator 206 is configured to receive sign signal b(k) and step size δ(k) and to generate $\hat{x}(k-1)$ therefrom. FIG. 4 is a block diagram 400 that shows how accumulator 206 operates to perform this function. In particular, as shown in FIG. 4, a first multiplier 402 and an adder 404 are configured to calculate a sample $\hat{y}(k)$ in accordance with:

$$\hat{y}(k) = \hat{x}(k-1) + b(k)\delta(k). \quad (4)$$

Sample $\hat{y}(k)$ is the CVSD-quantized version of input sample x(k) prior to application of a saturation function thereto. A delay block 410 is configured to introduce one clock cycle of delay such that $\hat{y}(k)$ becomes $\hat{y}(k-1)$. A logic block 412 is configured to apply a saturation function to $\hat{y}(k-1)$ to generate the CVSD-quantized version of input sample x(k−1). The saturation function is defined as:

$$y(k) = \begin{cases} \min(\hat{y}(k), y_{max}), & \hat{y}(k) \geq 0 \\ \max(\hat{y}(k), y_{min}), & \hat{y}(k) < 0, \end{cases} \quad (5)$$

wherein $y_{min}$ and $y_{max}$ are the accumulator's negative and positive saturation values, respectively. In some implementations, the parameter $y_{min}$ is set to $-2^{15}$ or $-2^{15}+1$ and the parameter $y_{max}$ is set to $2^{15}-1$. Finally, a second multiplier 408 is configured to multiply y(k−1) by the decay factor for the accumulator, denoted h, to produce the predicted version of the current input speech sample, denoted $\hat{x}(k-1)$. In some implementations, $$h = 1 - \frac{1}{32}.$$

Figure 3:
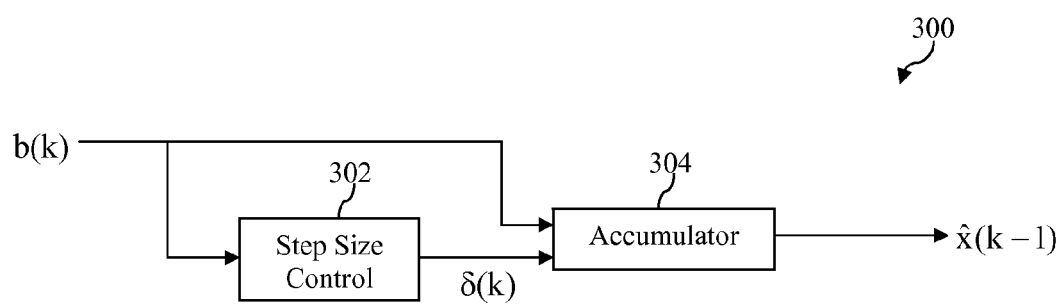
FIG. 3 is a block diagram of an example BLUETOOTH®-compliant CVSD decoder.

FIG. 3 is a functional block diagram of a CVSD decoder 300 that may be used to implement CVSD decoder 122 of system 100. As shown in FIG. 3, CVSD decoder 300 includes a step size control block 302 that is configured to operate in a like manner to step size control block 208 of CVSD encoder 200 and an accumulator 304 that is configured to operate in a like manner to accumulator 206 of CVSD encoder 200 of FIG. 2. The input to CVSD decoder 300 is a sign signal b(k) that was output by CVSD encoder 200. Based on the value of b(k), CVSD decoder 300 either adds or subtracts the current step size δ(k) to or from the predicted version of the current input speech sample, denoted x̂(k−1), to produce the CVSD-quantized version of the input speech sample, denoted y(k).

Figure 5:
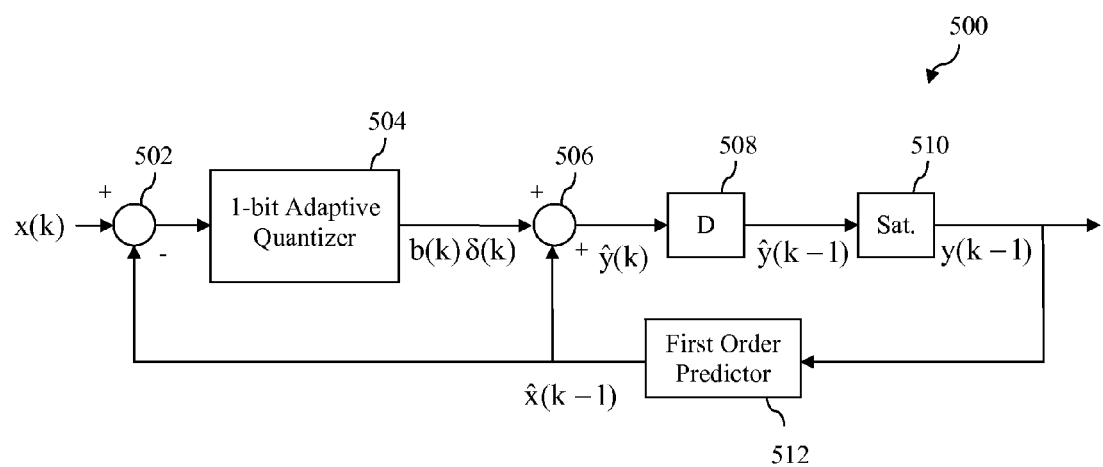
FIG. 5 is an alternate representation of an example BLUETOOTH®-compliant CVSD codec.

FIG. 5 is a block diagram that provides an alternate representation of the BLUETOOTH®-compliant codec previously described in reference to FIGS. 2-4, which is shown as CVSD codec 500.

As shown in FIG. 5, the input to CVSD codec 500 is denoted x(k), which is a speech sample of the 64 kHz input speech signal at time index k. A combiner 502 is configured to subtract a predicted version of the input speech sample x(k), denoted x̂(k−1), from input speech sample x(k), to produce a prediction error. A 1-bit adaptive quantizer 504 is configured to produce a quantized representation of the prediction error, denoted b(k)δ(k), which is the product of the sign signal b(k) and the step size for the current input sample δ(k). Thus, 1-bit adaptive quantizer 504 may be thought of as performing the operations of logic block 204 and step size control block 208 as described above in reference to FIG. 2 as well as the operations of multiplier 402 as discussed above in reference to FIG. 4.

CVSD codec further includes a combiner 506 that adds the quantized representation of the prediction error, b(k)δ(k), to the predicted version of the input speech sample x(k), denoted x̂(k−1), to produce a CVSD-quantized version of the input speech sample x(k) before saturation, denoted ŷ(k). A delay block 508 is configured to introduce one clock cycle of delay such that ŷ(k) becomes ŷ(k−1) and a logic block 510 applies a saturation function to ŷ(k−1) to generate the CVSD-quantized version of input sample x(k−1), denoted y(k−1), which is the output of CVSD codec 500 at time index k−1. The saturation function applied by logic block 510 may be that defined by Equation (5).

CVSD codec 500 still further includes a first-order predictor 508 that operates on y(k−1) to produce the predicted version of the input speech sample x(k), denoted x̂(k−1). First order predictor 508 performs this operation by multiplying y(k−1) by a parameter h, which is referred to above in reference to FIG. 2 as the decay factor for accumulator 206.

Figure 6:
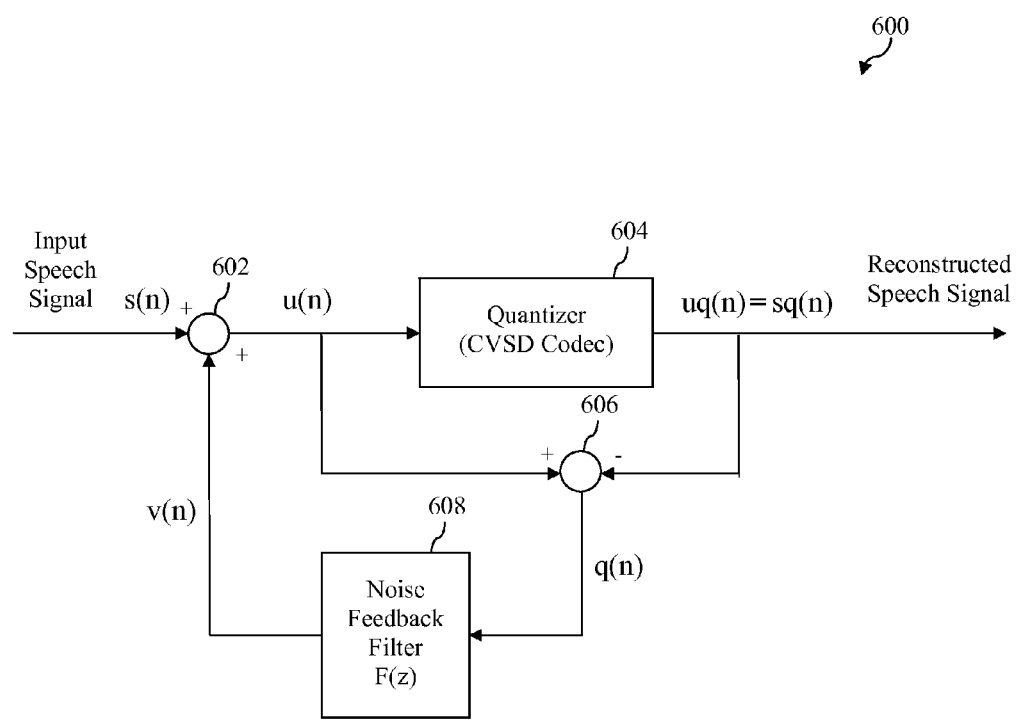
FIG. 6 is a block diagram of an example modified CVSD encoder structure that utilizes noise feedback coding (NFC) to improve speech quality in accordance with an embodiment.

C. Example Embodiment Illustrating Application of Noise Feedback Coding Technique to a CVSD Codec Implementation An example embodiment will now be described that applies a novel NFC technique at the encoder of the BLUETOOTH®-compliant CVSD codec discussed above to improve the quality of the speech signal produced at a corresponding CVSD decoder. FIG. 6 is a block diagram of a first representation of the modified encoder structure 600.

As shown in FIG. 6, in modified encoder structure 600, the example BLUETOOTH®-compliant CVSD codec is treated as a single block, denoted quantizer 604. The 64 kHz input speech signal is shown as input speech signal s(n). A combiner 602 operates to receive input speech signal s(n) and to add to it a noise feedback signal v(n) to produce a quantizer input signal u(n). Quantizer input signal u(n) is provided as the input signal to quantizer 604. Quantizer 604 operates on quantizer input signal u(n) to produce a CVSD-quantized version thereof, denoted quantized signal uq(n), which is also denoted reconstructed speech signal sq(n). A combiner 606 subtracts quantized signal uq(n) from quantizer input signal u(n) to produce a quantization noise signal q(n). A noise feedback filter 608 filters quantization noise signal q(n) to produce noise feedback signal v(n).

Figure 7:
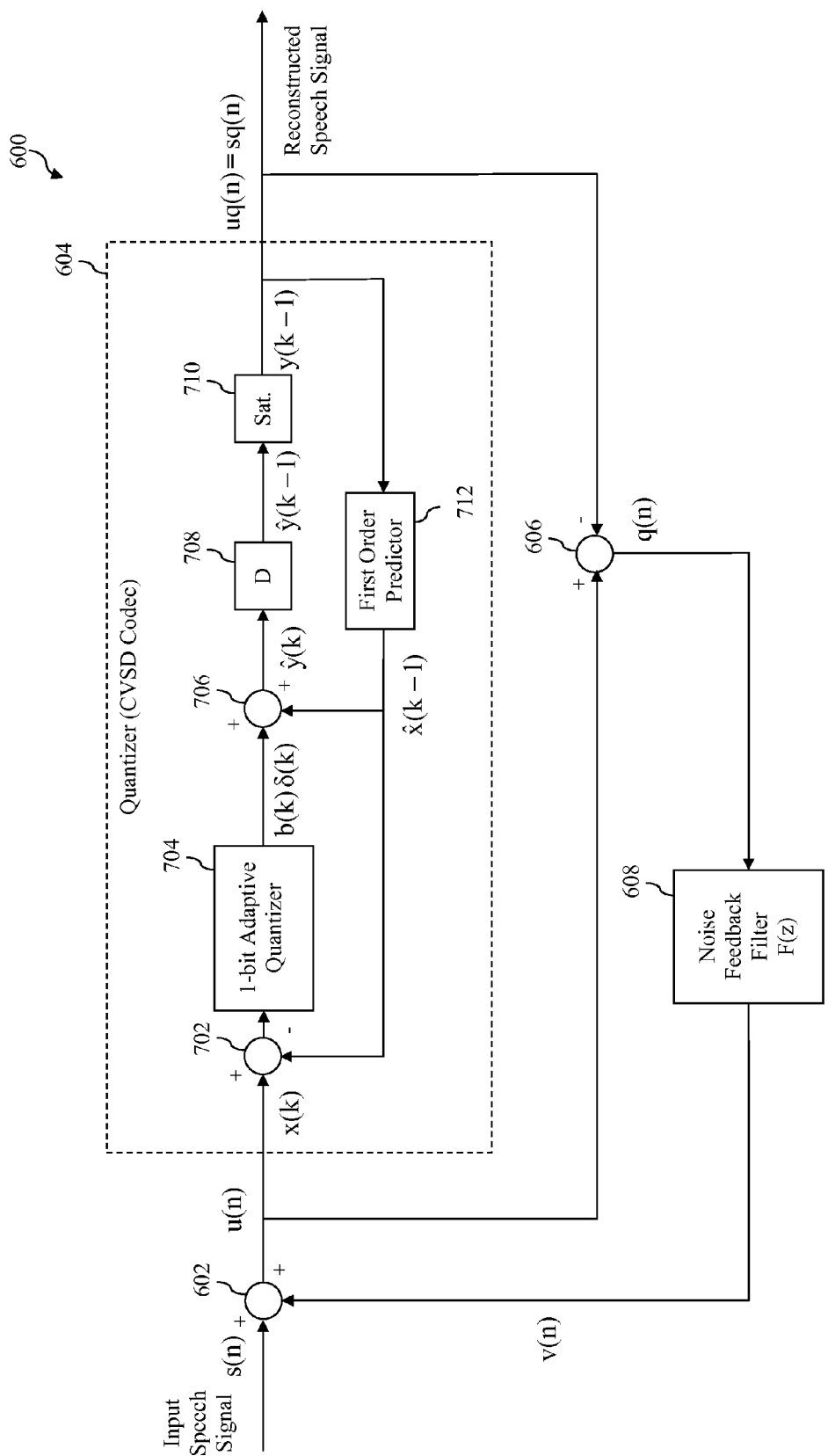
FIG. 7 is a block diagram of the example modified CVSD encoder structure shown in FIG. 6, with additional quantizer details provided.

FIG. 7 is a block diagram that provides a further representation of modified encoder structure 600 in which the structure of the CVSD codec is shown for the sake of completeness. As shown in FIG. 7, quantizer 604 includes the components of a CVSD codec such as that described above in reference to FIG. 5. In particular, quantizer 604 includes a combiner 702, a 1-bit adaptive quantizer 704, a combiner 706, a delay block 708, a logic block 710, and a first order predictor 712. These components are configured to perform the same functions, respectively, as combiner 502, 1-bit adaptive quantizer 504, combiner 506, delay block 508, logic block 510 and first order predictor 512 of CVSD codec 500 as discussed above in reference to FIG. 5.

The NFC techniques discussed herein are premised, in part, on the recognition that if the quantization bit-rate is sufficiently high, then the spectrum of the quantization noise q(n) will be sufficiently flat such that it can be effectively shaped using noise feedback filter 608. Such noise spectral shaping can improve the perceptual quality of the coded speech signal. For example, the spectrum of the coding noise may be adaptively shaped so that it follows the input speech spectrum to some extent. In effect, this makes the coding noise more speech-like. Due to the noise masking effect of human hearing, such shaped noise is less audible to human ears.

For modified codec structure 600, the coding noise, denoted r(n), may be represented as:

$$r(n) = s(n) - sq(n). \qquad (6)$$

Since s(n)=u(n)−v(n) as shown in FIGS. 6 and 7, Equation 6 may be expanded as follows:

$$r(n) = u(n) - v(n) - sq(n). \qquad (7)$$

Furthermore, since quantization noise signal q(n)=u(n)−sq(n), Equation (7) may also be rewritten as:

$$r(n) = q(n) - v(n). \qquad (8)$$

If noise feedback filter 608 has the transfer function of $$F(z) = \sum_{i=1}^{L} f_i z^{-i}, \qquad (9)$$

where L is the order of noise feedback filter 608, then Equation (8) may also be written as:

$$r(n) = q(n) - \sum_{i=1}^{L} f_i q(n-i), \qquad (10)$$

or in terms of z-transform representation, $$R(z) = [1 - F(z)]Q(z) = N(z)Q(z). \qquad (11)$$

Thus, if Q(z) is flat, then the coding noise of modified encoder structure 600 will have a spectral shape of the frequency response of N(z)=1−F(z).

In an embodiment, a noise feedback filter F(z) is used that reduces the level of the noise in the 0-4 kHz passband of a CVSD-encoded 64 kHz speech signal in exchange for increased noise in the 4-32 kHz stopband of that signal. Such an approach may be used, for example, if SRC filters present in a down-sampling component associated with a CVSD decoder (such as down-sampling component 124 described above in reference to example BLUETOOTH® wireless communication system 100) can be relied upon to attenuate such increased stopband noise to avoid aliasing when down-sampling to 8 kHz.

For example, in accordance with such an embodiment, a $2^{nd}$-order finite impulse response (FIR) filter may be used in which a zero is placed at a radius r and an angle of $\theta=(f_z/32)\pi$. Accordingly, noise feedback filter F(z) will have a frequency response $$F(z)=(2r\cos\theta)z^{-1}-r^2z^{-2}, \quad (12)$$

and the corresponding N(z) is $$N(z)=1-(2r\cos\theta)z^{-1}+r^2z^{-2}. \quad (13)$$

Figure 8:
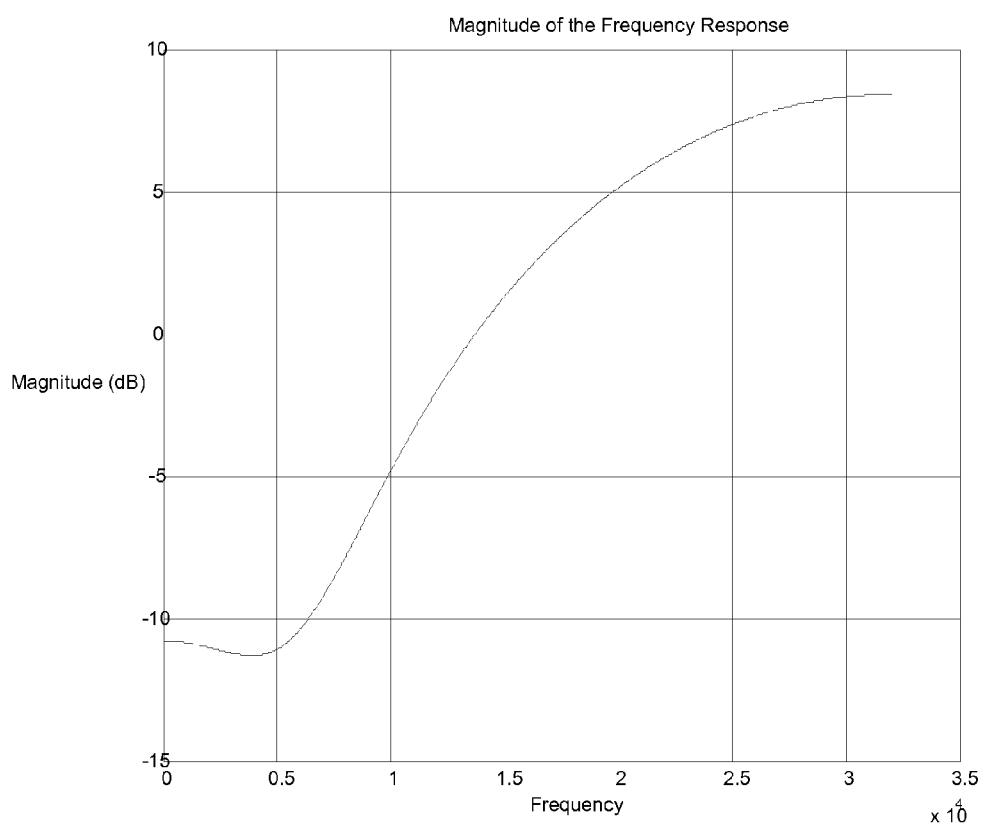
FIG. 8 illustrates a frequency response obtained using a second-order finite impulse response (FIR) noise feedback filter in accordance with an embodiment.

In accordance with such an implementation, the closer r is to 1, the greater the reduction of coding noise in the 0-4 kHz passband, at the cost of increased coding noise in the 4-32 kHz stopband. To select appropriate values for r and θ, for each given r, θ can be adjusted so that the lowest point of the frequency response occurs at approximately 4 kHz. Then r and $f_z$ may be tuned to achieve improved speech quality. For example, r and $f_z$ may be tuned so that the output speech signal achieves the highest PESQ score. In one implementation, it was determined that r=0.68 and $f_z$=5.4 produced the best speech quality. The frequency response associated with such an implementation is shown in FIG. 8. As can be seen in FIG. 8, the level of the coding noise in the 0-4 kHz passband is attenuated while the level of the coding noise in the higher frequencies is increased. Furthermore, the spectrum of the coding noise in the 0-4 kHz passband is slightly down-sloping such that it follows the spectrum of the input speech to some extent. This increases the likelihood that the coding noise will be masked by the input speech.

The foregoing implementation is advantageous in that it can be achieved with very little additional computational complexity. The step of subtracting sq(n), the output of quantizer 604, from u(n), the input of quantizer 604, requires only one additional operation per 64 kHz sample. The steps of feeding the resulting quantization noise q(n) through the second-order FIR filter having the frequency response described by Equation (12) and adding the output of the second-order FIR filter to the input signal s(n) can be implemented together with only two multiply-accumulate operations per 64 kHz sample. Taken together, that is a total of (1+2)*64,000=192,000 operations per second. A small amount of memory is also required to implement noise feedback filter 608. Such a simple and low-complexity modification to the CVSD encoder can easily be implemented in hardware and/or software.

Of course, alternative noise feedback filter designs may be used. For example, a noise feedback filter may be selected that performs local spectral shaping within the 0-4 kHz passband without increasing the average noise power in the 4 to 32 kHz stopband. Such an approach may be desired in case SRC filters present in a down-sampling component associated with a CVSD decoder (such as down-sampling component 124 described above in reference to example BLUETOOTH® wireless communication system 100) cannot be relied upon to attenuate increased stopband noise sufficiently to prevent aliasing from causing audible distortion when down-sampling to 8 kHz.

As another example, two additional zeros can be added to the FIR filter to obtain a $4^{th}$-order noise feedback filter that can provide increased flexibility in shaping the coding noise. Still higher filter orders may be used. To also achieve increased flexibility in shaping the coding noise, pole-zero infinite impulse response (IIR) filters may also be used to implement F(z) and N(z).

As yet another example, rather than performing fixed noise spectral shaping, an adaptive noise feedback filter may be used to perform adaptive noise spectral shaping. For example, an adaptive noise feedback filter may be used in order to better match filter performance to the changing speech formants and pitch period of the input speech signal, thereby improving the masking of the coding noise by the input speech signal. This can lead to better noise spectral shaping and a lower perceived level of coding noise. In accordance with certain implementations, an adaptive noise feedback filter prototype may be derived that tracks the spectrum of the 8 kHz input speech signal received at the CVSD encoder. The impulse response of such an adaptive noise feedback filter prototype derived from the 8 kHz input signal may then be up-sampled to 64 kHz and even convolved with the simple $2^{nd}$-order or $4^{th}$-order FIR filters discussed above.

In accordance with certain embodiments, the CVSD codec that comprises quantizer 604 may be modified to improve the quantizer resolution thereof, which in turn may give rise to more effective noise spectral shaping. For example, the CVSD codec may be modified to use delayed-decision coding techniques such as tree coding or vector quantization to effectively increase the quantizer performance and the effectiveness of noise spectral shaping without affecting interoperability.

Figure 9:
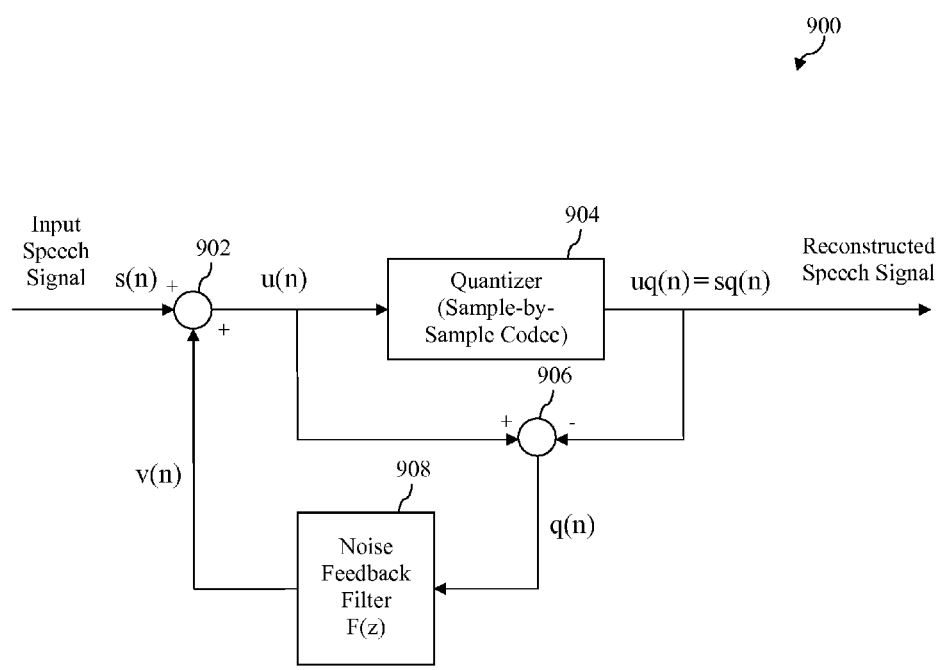
FIG. 9 is a block diagram of an example modified sample-by-sample encoder structure that utilizes NFC to improve speech quality in accordance with an embodiment.

D. Example Generalized Embodiment Illustrating Application of Noise Feedback Coding Technique to any Sample-by-Sample Codec FIG. 9 is a block diagram of a generalized encoder structure 900 that can be used to apply the novel NFC techniques described herein to the encoder of any sample-by-sample audio codec to improve the quality of the audio signal produced at a corresponding decoder. The audio codec may comprise, for example, a codec that is configured to encode and decode speech signals, a codec that is configured to encode and decode music signals, or a codec that is configured to encode and decode both speech and music signals.

As shown in FIG. 9, in modified encoder structure 900, a sample-by-sample audio codec is treated as a single block, denoted quantizer 904. A combiner 902 operates to receive an input audio signal s(n) and to add to it a noise feedback signal v(n) to produce a quantizer input signal u(n). Quantizer input signal u(n) is provided as the input signal to quantizer 904. Quantizer 904 operates on quantizer input signal u(n) to produce a quantized version thereof, denoted quantized signal uq(n), which is also denoted reconstructed audio signal sq(n). A combiner 906 subtracts quantized signal uq(n) from quantizer input signal u(n) to produce a quantization noise signal q(n). A noise feedback filter 908 filters quantization noise signal q(n) to produce noise feedback signal v(n).

As discussed in the preceding section, the sample-by-sample audio codec that comprises quantizer 904 may be a delta modulation codec such as a CVSD codec. However, the sample-by-sample audio codec may also comprise any of a wide variety of sample-by-sample codecs currently in existence as well as any developed in the future. By way of example and without limitation, the sample-by-sample audio codec may comprise a G.711μ-law codec, an LCPM codec, a G.726 ADPCM codec or the like. Modified encoder structure 900 can advantageously provide noise spectral shaping to such sample-by-sample codec. Such noise spectral shaping can be used to mask coding noise, thereby improving the quality of the output audio signal generated by the codec. Since the technique does not affect bit-stream compatibility, the improvement in audio quality can be achieved in a manner that will not create encoder-decoder interoperability issues. The modifications to the encoder can be easily implemented in hardware and/or software and can be achieved in a low-complexity fashion.

Figure 10:
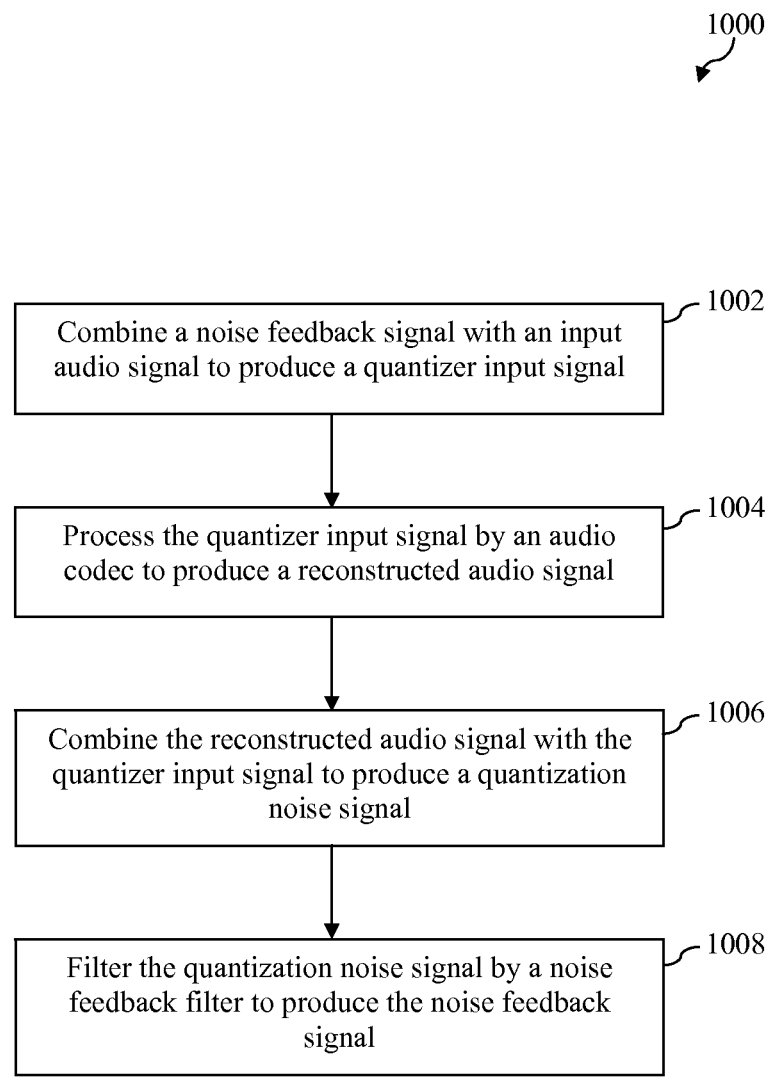
FIG. 10 depicts a flowchart of an example NFC method that may be used to provide improved quality of a reconstructed audio signal output by any sample-by-sample audio codec in accordance with an embodiment.

FIG. 10 depicts a flowchart 1000 of a method that may be used to provide improved quality of a reconstructed audio signal output by any sample-by-sample audio codec in accordance with an embodiment. The method of flowchart 1000 may be implemented, for example, by modified encoder structure 600 as described above in reference to FIGS. 6 and 7, or by modified encoder structure 900 as described above in reference to FIG. 9. The method may be implemented by other structures as well.

As shown in FIG. 10, the method of flowchart 1000 begins at step 1002, in which a noise feedback signal is combined with an input audio signal to produce a quantizer input signal. This step may be performed, for example, by combiner 602 of modified encoder structure 600 or by combiner 902 of modified encoder structure 900.

At step 1004, the quantizer input signal is processed by a sample-by-sample audio codec to produce a reconstructed audio signal. This step may be performed, for example, by the CVSD codec that comprises quantizer 604 of modified encoder structure 600 or by the sample-by-sample audio codec that comprises quantizer 904 of modified encoder structure 900. The audio codec may comprise a delta modulation codec, such as a CVSD codec. In certain embodiments, the audio codec may comprise a version of a CVSD codec that has been modified to use a delayed-decision coding technique to improve the quantization resolution thereof.

At step 1006, the reconstructed audio signal is combined with the quantizer input signal obtained in step 1002 to produce a quantization noise signal. This step may be performed, for example, by combiner 606 of modified encoder structure 600 or by combiner 906 of modified encoder structure 900.

At step 1008, the quantization noise signal is filtered by a noise feedback filter to produce the noise feedback signal. This step may be performed, for example, by noise feedback filter 608 of modified encoder structure 600 or by noise feedback filter 908 of modified encoder structure 900. The noise feedback filter may comprise, for example, an FIR filter, such as a second-order FIR filter, a fourth-order FIR filter, or some higher-order FIR filter. In one embodiment, the FIR filter comprise a second-order FIR filter having a frequency response F(z), wherein $F(z)=(2r \cos \theta)z^{-1}-r^2z^{-2}$. The noise feedback filter may also comprise a pole-zero infinite impulse response (IIR) filter. The noise feedback filter may still further comprise an adaptive noise feedback filter having at least one filter parameter that is modified in response to changes in the input audio signal.

E. Example Computer System Implementation

Each of the elements of modified encoder structure 600 and modified encoder structure 900 may be implemented in hardware, by software executed by a processing unit, or by a combination thereof. In certain embodiments, modified encoder structure 600 may be implemented in a BLUETOOTH® wireless communication system such as that described above in reference to FIG. 1 by replacing CVSD encoder 114 with modified encoder structure 600. In such a system, each of the up-sampling stage, the modified CVSD encoder, the CVSD decoder, and the down-sampling stage may be implemented in hardware, by software executed by a processing unit, or by a combination thereof. Furthermore, each of the steps of flowchart 1000 may be implemented in hardware, by software executed by a processing unit, or by a combination thereof.

Where elements or steps described herein are implemented by software executed by a processing unit, such elements or steps may be implemented by one or more processor-based computer systems. An example of such a computer system 1100 is depicted in FIG. 11.

Figure 11:
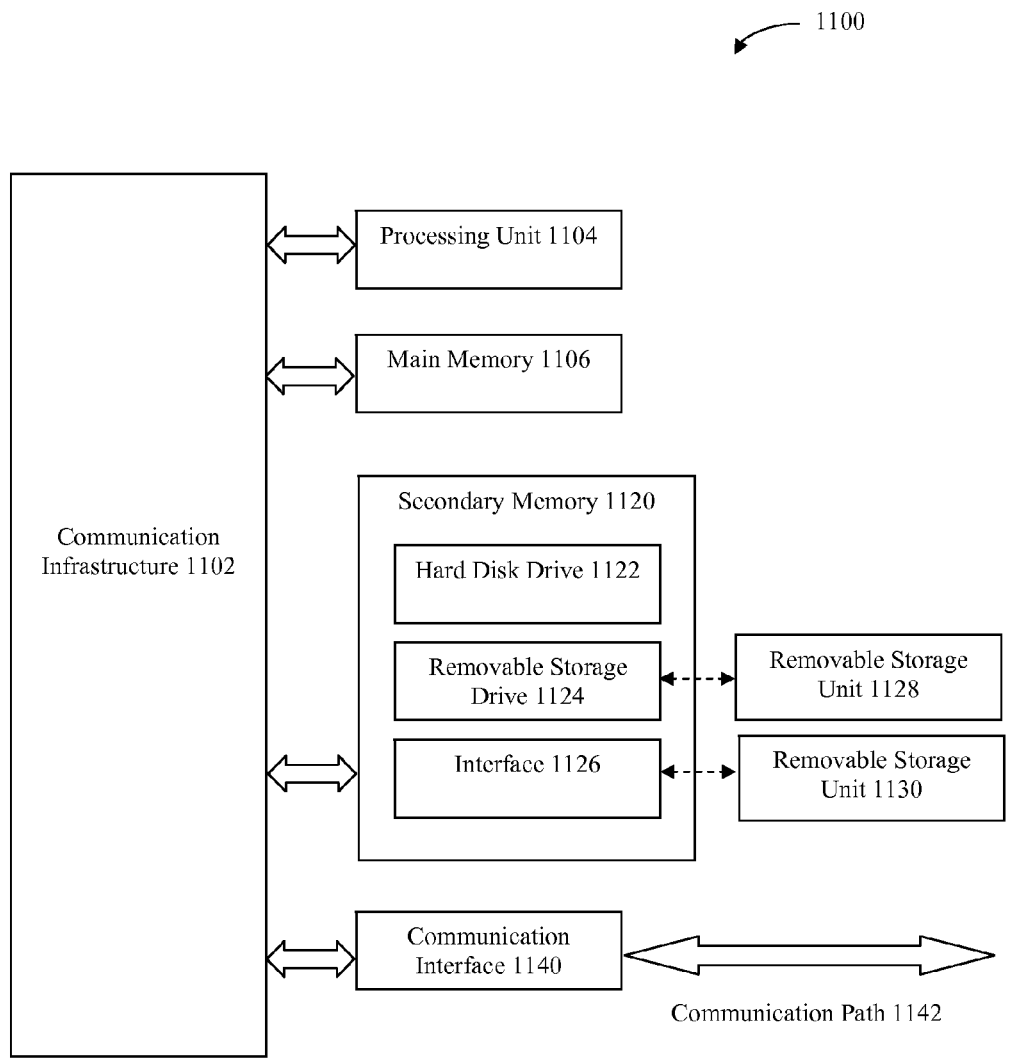
FIG. 11 is a block diagram of a processor-based system that may be used to implement various embodiments described herein.

As shown in FIG. 11, computer system 1100 includes a processing unit 1104 that includes one or more processors or processor cores. Processor unit 1104 is connected to a communication infrastructure 1102, which may comprise, for example, a bus or a network.

Computer system 1100 also includes a main memory 1106, preferably random access memory (RAM), and may also include a secondary memory 1120. Secondary memory 1120 may include, for example, a hard disk drive 1122, a removable storage drive 1124, and/or a memory stick. Removable storage drive 1124 may comprise a floppy disk drive, a magnetic tape drive, an optical disk drive, a flash memory, or the like. Removable storage drive 1124 reads from and/or writes to a removable storage unit 1128 in a well-known manner. Removable storage unit 1128 may comprise a floppy disk, magnetic tape, optical disk, or the like, which is read by and written to by removable storage drive 1124. As will be appreciated by persons skilled in the relevant art(s), removable storage unit 1128 includes a computer-readable storage medium having stored therein computer software and/or data.

In alternative implementations, secondary memory 1120 may include other similar means for allowing computer programs or other instructions to be loaded into computer system 1100. Such means may include, for example, a removable storage unit 1130 and an interface 1126. Examples of such means may include a program cartridge and cartridge interface (such as that found in video game devices), a removable memory chip (such as an EPROM, or PROM) and associated socket, and other removable storage units 1130 and interfaces 1126 which allow software and data to be transferred from the removable storage unit 1130 to computer system 1100.

Computer system 1100 may also include a communication interface 1140. Communication interface 1140 allows software and data to be transferred between computer system 1100 and external devices. Examples of communication interface 1140 may include a modem, a network interface (such as an Ethernet card), a communications port, a PCM-CIA slot and card, or the like. Software and data transferred via communication interface 1140 are in the form of signals which may be electronic, electromagnetic, optical, or other signals capable of being received by communication interface 1140. These signals are provided to communication interface 1140 via a communication path 1142. Communications path 1142 carries signals and may be implemented using wire or cable, fiber optics, a phone line, a cellular phone link, an RF link and other communications channels.

As used herein, the terms "computer program medium" and "computer readable medium" are used to generally refer to non-transitory media such as removable storage unit 1128, removable storage unit 1130 and a hard disk installed in hard disk drive 1122. Computer program medium and computer readable medium can also refer to non-transitory memories, such as main memory 1106 and secondary memory 1120, which can be semiconductor devices (e.g., DRAMs, etc.). These computer program products are means for providing software to computer system 1100.

Computer programs (also called computer control logic, programming logic, or logic) are stored in main memory 1106 and/or secondary memory 1120. Computer programs may also be received via communication interface 1140. Such computer programs, when executed, enable the computer system 1100 to implement features of the present invention as discussed herein. Accordingly, such computer programs represent controllers of the computer system 1100. Where the invention is implemented using software, the software may be stored in a computer program product and loaded into computer system 1100 using removable storage drive 1124, interface 1126, or communication interface 1140.

The invention is also directed to computer program products comprising software stored on any computer readable medium. Such software, when executed in one or more data processing devices, causes a data processing device(s) to operate as described herein. Embodiments of the present invention employ any computer readable medium, known now or in the future. Examples of computer readable mediums include, but are not limited to, primary storage devices (e.g., any type of random access memory) and secondary storage devices (e.g., hard drives, floppy disks, CD ROMS, zip disks, tapes, magnetic storage devices, optical storage devices, MEMs, nanotechnology-based storage device, etc.).

F. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. A method for providing improved quality of a reconstructed audio signal output by an audio codec, comprising:
   combining only a noise feedback signal with an input audio signal to produce a quantizer input signal, wherein the input audio signal comprises one of a speech signal or a music signal;
   processing the quantizer input signal by the audio codec to produce a reconstructed audio signal, wherein the reconstructed audio signal comprises one of a reconstructed speech signal or a reconstructed music signal;
   combining the reconstructed audio signal with the quantizer input signal to produce a quantization noise signal; and
   filtering the quantization noise signal by a noise feedback filter to produce the noise feedback signal.

2. The method of claim 1, wherein the audio codec comprises a delta modulation codec.

3. The method of claim 2, wherein the delta modulation codec comprises a Continuously Variable Slope Delta Modulation (CVSD) codec.

4. The method of claim 2, wherein the delta modulation codec comprises a version of a Continuously Variable Slope Delta (CVSD) codec that has been modified to use a delayed-decision coding technique.

5. The method of claim 1, wherein filtering the quantization noise signal by the noise feedback filter comprises:
   filtering the quantization noise signal using a finite impulse response (FIR) filter.

6. The method of claim 5, wherein filtering the quantization noise signal using the finite impulse response (FIR) filter comprises:
   filtering the quantization noise signal by a second-order FIR filter having a frequency response F(z), wherein $$F(z)=(2r\cos\theta)z^{-1}-r^2z^{-2}.$$

7. The method of claim 1, wherein filtering the quantization noise signal by the noise feedback filter comprises:
   filtering the quantization noise signal using a pole-zero infinite impulse response (IIR) filter.

8. The method of claim 1, wherein filtering the quantization noise signal by the noise feedback filter comprises:
   filtering the quantization noise signal by an adaptive noise feedback filter having at least one filter parameter that is modified in response to changes in the input audio signal.

9. A system that encodes an input audio signal, comprising:
   a first combiner that combines only a noise feedback signal with the input audio signal to produce a quantizer input signal, wherein the input audio signal comprises one of a speech signal or a music signal;
   a quantizer that processes the quantizer input signal to produce a quantized version of the quantizer input signal, the quantized version of the quantizer input signal comprises one of a reconstructed speech signal or a reconstructed music signal;
   a second combiner that combines the quantized version of the quantizer input signal with the quantizer input signal to produce a quantization noise signal; and
   a noise feedback filter that filters the quantization noise signal to produce the noise feedback signal.

10. The system of claim 9, wherein the quantizer comprises an audio codec.

11. The system of claim 10, wherein the audio codec comprises a delta modulation codec.

12. The system of claim 11, wherein the delta modulation codec comprises a Continuously Variable Slope Delta Modulation (CVSD) codec.

13. The system of claim 11, wherein the delta modulation codec comprises a version of a Continuously Variable Slope Delta (CVSD) codec that has been modified to use a delayed-decision coding technique.

14. The system of claim 9, wherein the noise feedback filter comprises a finite impulse response (FIR) filter.

15. The system of claim 14, wherein the FIR filter comprises a second-order FIR filter having a frequency response F(z), wherein $$F(z)=(2r\cos\theta)z^{-1}-r^2z^{-2}.$$

16. The system of claim 9, wherein the noise feedback filter comprises a pole-zero infinite impulse response (IIR) filter.

17. The system of claim 9, wherein the noise feedback filter comprises an adaptive filter having at least one filter parameter that is modified in response to changes in the input audio signal.

18. A computer program product comprising a non-transitory computer-readable storage medium having computer logic recorded thereon, the computer logic being executable by a processing unit to cause the processing unit to perform steps comprising:

combining only a noise feedback signal with an input audio signal to produce a quantizer input signal, wherein the input audio signal comprises one of a speech signal or a music signal;

processing the quantizer input signal in an audio codec to produce a reconstructed audio signal, wherein the reconstructed audio signal comprises one of a reconstructed speech signal or a reconstructed music signal;

combining the reconstructed audio signal with the quantizer input signal to produce a quantization noise signal; and filtering the quantization noise signal by a noise feedback filter to produce the noise feedback signal.

19. The computer program product of claim 18, wherein the audio codec comprises a delta modulation codec.

20. The system of claim 19, wherein the delta modulation codec comprises a Continuously Variable Slope Delta Modulation (CVSD) codec.

\* \* \* \* \*